US008163330B2

(12) United States Patent
Rana et al.

(10) Patent No.: US 8,163,330 B2
(45) Date of Patent: Apr. 24, 2012

(54) MOLTEN METAL SPRAYING FOR METALLIZATION APPLICATION IN SOLAR CELLS

(75) Inventors: Virendra V. Rana, Los Gatos, CA (US); Robert Z. Bachrach, Burlingame, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1217 days.

(21) Appl. No.: 11/877,826

(22) Filed: Oct. 24, 2007

(65) Prior Publication Data

US 2009/0110808 A1  Apr. 30, 2009

(51) Int. Cl.
*B05D 5/12* (2006.01)
(52) U.S. Cl. ........... 427/74; 427/270; 427/422; 427/427
(58) Field of Classification Search .................... 427/74, 427/270, 422, 427
See application file for complete search history.

(56) References Cited

U.S. PATENT DOCUMENTS

| 4,297,391 | A | 10/1981 | Lindmayer |
| 5,964,418 | A | 10/1999 | Scarpa et al. |
| 2004/0261839 | A1 | 12/2004 | Gee et al. |

OTHER PUBLICATIONS

International Search Report issued Mar. 6, 2009 in PCT/US2008/078978.
Preu, R., et al., "Laser-Fired Contacts—Transfer of a Simple High Efficiency Process Scheme to Industrial Production," pp. 130-133, 2002 IEEE.

*Primary Examiner* — Mark A Osele
*Assistant Examiner* — Nickolas Harm
(74) *Attorney, Agent, or Firm* — Mark J. Danielson; Pillsbury Winthrop Shaw Pittman LLP

(57) ABSTRACT

The present invention provides a method of making back side contacts and back surface fields in photovoltaic devices such as silicon solar cells. According to one aspect, the process of the present invention is a non-contact process, overcoming many of the problems of the prior art. According to certain aspects, molten aluminum is used to form the contact regions as opposed to the screen printing process of the prior art. According to additional aspects, the process can be used to form the distributed point contacts and localized back surface fields for dielectric passivated back surface. According to still further aspects, molten aluminum spray and/or atomization is used for the back side metallization.

11 Claims, 5 Drawing Sheets

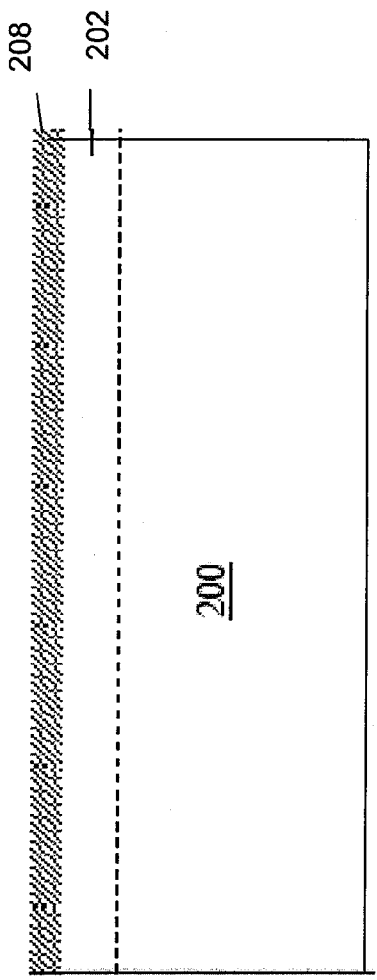
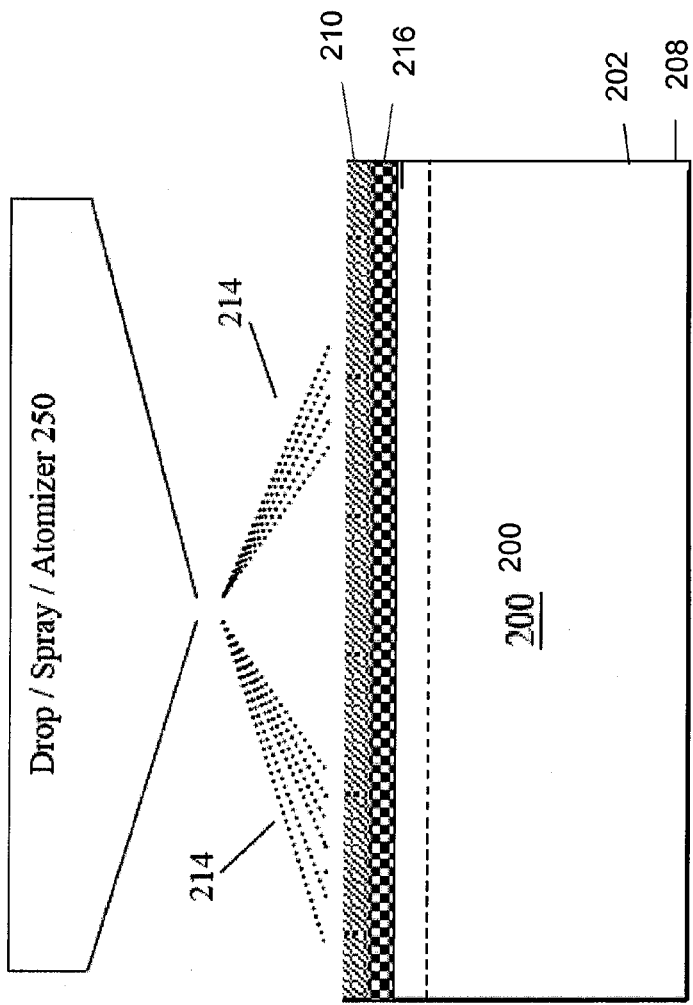
FIG. 2A
FIG. 2B

MOLTEN METAL SPRAYING FOR METALLIZATION APPLICATION IN SOLAR CELLS

FIELD OF THE INVENTION

The present invention relates generally to photovoltaic devices, and more particularly to forming backside metal contacts with back surface fields in silicon solar cells.

BACKGROUND OF THE INVENTION

Photovoltaics (PV) or solar cells are devices which convert sunlight into direct current (DC) electrical power. The most common type of solar cells are crystalline silicon cells, as opposed to cells comprised of thin films of amorphous or microcrystalline silicon and other photovoltaic materials such as CdTe, CIGS, etc. A typical crystalline silicon PV cell includes a p type silicon wafer, substrate or sheet typically less than about 0.3 mm thick with a thin layer of n-type silicon on top of a p-type region formed in a substrate. The generated voltage, or photo-voltage, and generated current by the photovoltaic device are dependent on the material properties of the p-n junction and the surface area of the device. When exposed to sunlight (consisting of energy from photons), pairs of free electrons and holes are generated in the silicon. The electric field formed across the depletion region of p-n junction separates the free electrons and holes, creating a voltage. An external circuit from n-side to p-side allows the flow of electrons when the PV cell is connected to an electrical load. Electrical power is the product of the voltage times the current generated as the electrons and holes move through an external load and eventually recombine. Given a specific size, the specific materials used, and the photovoltaic conversion efficiency of those materials, solar cells generate a specific amount of power. Individual cells are further typically tiled into modules sized to deliver a desired amount of system power. Solar modules are typically created by connecting a number of solar cells that are placed in panels with specific frames and connectors.

FIGS. 1A to C illustrate a conventional method to process silicon wafers to produce a silicon solar cell. As shown in FIG. 1A, a p-type silicon substrate 100 is doped with n-type material to form a n-type region 102 adjacent to one surface (e.g. a front surface) of the substrate. The silicon substrate 100 can be comprised of a wafer about 0.25 mm thick.

Next, typically a passivation layer 108 (e.g. SiN) is deposited on the front surface of the substrate 100. This layer also acts as an anti-reflection layer to reduce the reflection of incident photons. Next, as shown in FIG. 1B, a screen printing method is used to pattern front contacts on a front surface of substrate 100. More particularly, front contact pad 104 is patterned on the front surface using a silver/glass frit paste and screen printing techniques. For backside metallization, aluminum/glass frit paste 110 is applied to the full back surface of substrate 100 (e.g. by screen-printing or rolling).

In a next step shown in FIG. 1C, the front and back sides of the wafer are co-fired using 'spike' anneal to a temperature up to 850° C., causing silver to diffuse into the front side of the silicon substrate through the passivation layer and make contact to the doped n-type region 102, thereby forming contact regions 106 underlying front contact pad 104. During the spike anneal, the wafer is held, for a few seconds, slightly above the Al—Si eutectic temperature of 577° C. that causes the Al—Si alloy to form at the boundary of the paste 110 and substrate 100. On cooling, the silicon, saturated with aluminum, precipitates out and a p+ type layer 112 is formed adjacent the back surface, thereby forming the back contact and the back surface field (BSF). This field acts to repel electrons, thereby enhancing the flow of electrons in the desired current flow direction when the substrate is exposed to light and the substrate is used in a PV module.

For the back-side metallization, the problems with this conventional processes include: (1) the reflectance of the Al/Si interface is degraded due to the diffusion of Si in Al that has a considerable amount of frit, (2) the resulting aluminum film, being highly porous with entrained surface oxide, has higher resistivity and poor strength, and (3) wafer bowing related to the densification of the paste containing a high amount of frit.

Other alternatives for forming a BSF in a solar cell have been proposed. In one example, a special process is used to make the back side field using boron doped oxide. Additional prior art techniques include those described in U.S. Pat. No. 4,297,391. This describes a process of spraying high temperature conductive material on a photovoltaic cell using plasma. However, the techniques described therein project the metal particles at a very high velocity and temperature that may not be suitable for solar cell wafers.

However, there remains a need in the art for a process that can form the back contact with a back surface field in a solar cell substrate that does not suffer from problems such as those described above.

SUMMARY OF THE INVENTION

The present invention provides a method of making back side contact with back surface fields in photovoltaic devices such as silicon solar cells. According to one aspect, the process of the present invention is a non-contact process, overcoming many of the problems of the prior art. According to certain aspects, molten aluminum is used to form back side contact and the back surface field as opposed to the screen printing processes of the prior art. According to additional aspects, the back-side field forms as the aluminum droplets cool in contact with the silicon substrate. According to still further aspects molten aluminum spray and/or atomization is used for the back side metallization.

By virtue of the invention, the process to form solar cells can be performed quickly, leading to lower costs for high volume manufacturing. Moreover, the process yields a highly reflective Al/Si interface, achieves a back side aluminum film that is fully dense and close to lowest resistivity, and reduces wafer bowing as compared to conventional processes.

In furtherance of these and other aspects, a method for processing a solar cell substrate, includes projecting drops of metal in a molten state from the metal applicator toward the back side of the solar cell substrate so as to metallize the back side of the solar cell substrate to form back contact, back surface field and a highly reflective film over the whole backside.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein:

FIGS. 2A to 2F illustrate an example method for processing a silicon substrate in accordance with certain aspects of the invention.

DETAILED DESCRIPTION OF THE PREFERRED EMBODIMENTS

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

In general, the present invention provides a non-contact process for forming back contacts and back-surface fields in a solar cell substrate. In general such processing is performed to provide a reflective metal surface over the whole backside for reflection of the incident sunlight and to form the back surface field (BSF).

According to certain aspects, aluminum is used to form the back contact and the back surface field. According to still further aspects of the invention, liquid metal spraying is used to form the backside metallization. According to additional aspects, back-side field (BSF) is formed during cooling of the molten aluminum droplet in contact with the silicon substrate.

Figure 1A:
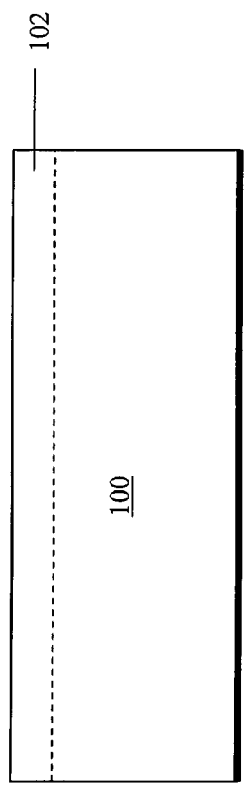
FIGS. 1A to 1C illustrate conventional processes for forming contacts and a back-surface field in silicon solar cell substrates.
Figure 1B:
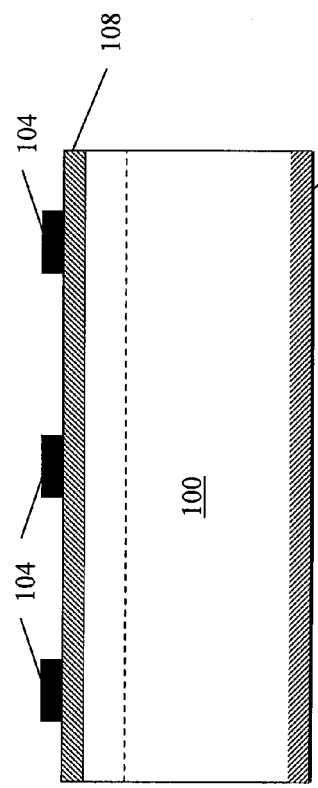
Figure 1C:
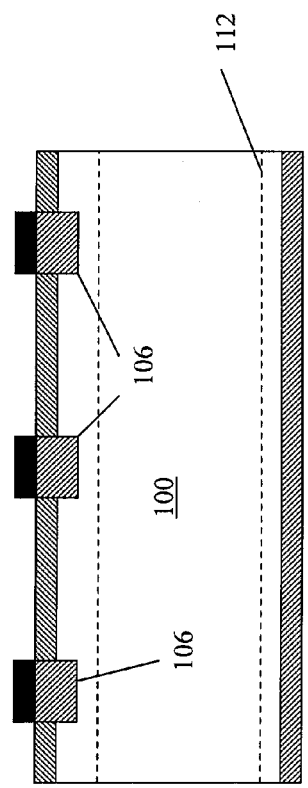
Figure 2C:
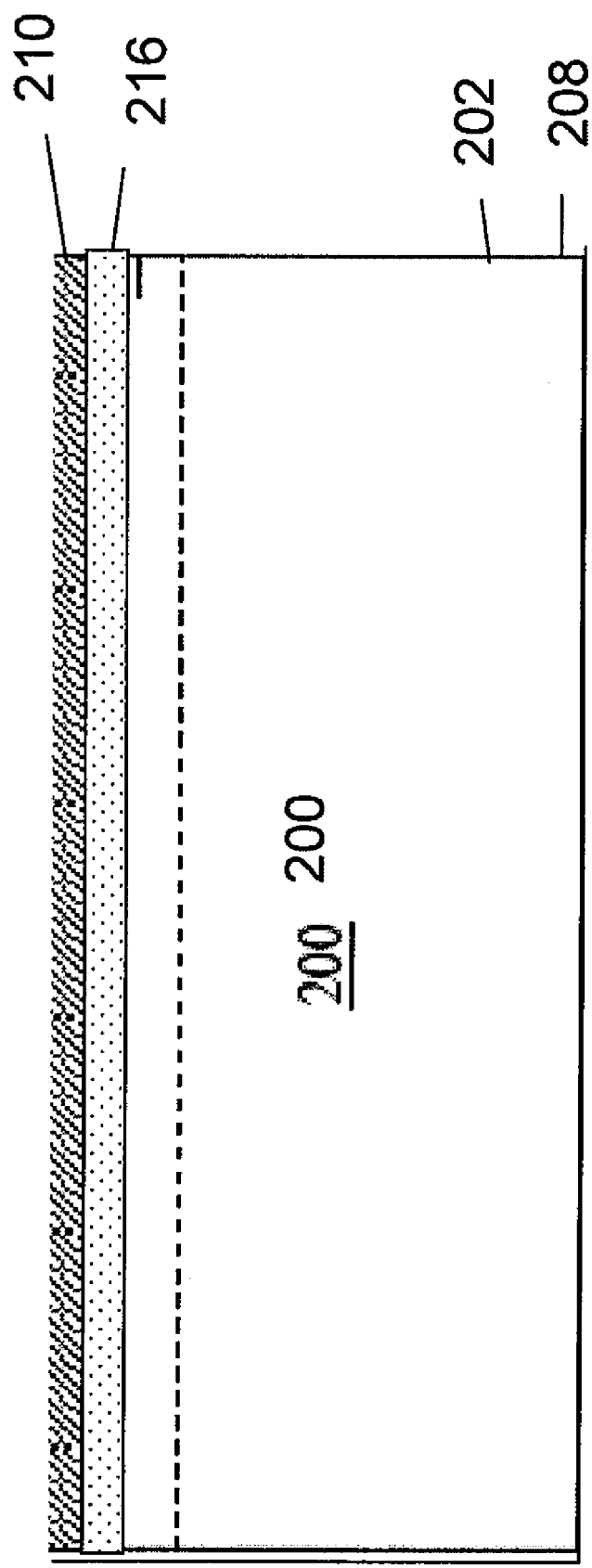

An example method of back side processing according to aspects of the invention is shown in FIGS. 2A-2C. It should be noted that these figures are not necessarily to scale, and certain features may be exaggerated, minimized or omitted for sake of illustration. Moreover, it should be apparent that these figures provide only one perspective view and illustrate only a small portion of a substrate that is being processed, and that similar or alternative processing can be performed on other parts of the same structure. Still further, it should be appreciated that not all of the processing steps need to be practiced together, nor in a single processing sequence or chamber, nor in the order shown.

As shown in FIG. 2A, similar to the conventional process, a p-type silicon substrate 200 is doped with n-type material to form a thin n-type region 202 adjacent to the front surface. The silicon substrate 200 can be comprised of a wafer about 0.3 mm thick. Any conventional process may be used to perform the doping. It should be noted that similar cells can be achieved with different polarity types, and the invention is not limited to this example. Moreover, the invention can be practiced with different types of substrates other than silicon. Still further, the term "front" surface is used herein generally to distinguish between the two surfaces of the substrate, the other surface being referred to herein as the "back" surface. However, in a preferred but non-limiting example, the term "front" surface also refers to a typical solar cell surface that faces and receives light during operation.

As further shown, a passivation layer (e.g. SiN) 208 is formed on the front surface of the substrate 200 before metallization. For backside metallization the wafers are placed upside down with the back side facing up, as reflected in the following descriptions and figures.

Next, as shown in FIG. 2B, molten aluminum 214 is dropped or sprayed by applicator 250. Applicator 250 can be any device that can be adapted for forming the metal drops and/or spray having the properties described in more detail below. There are several different types of known and proprietary devices that can be used. See generally, Arthur H. Lefebvre, "Atomization and Sprays," 1988 ISBN-13: 978-0891166030, the contents of which are incorporated herein by reference. These devices include pressure atomizers, rotary atomizers and twin fluid atomizers. For purposes of the invention, a free-fall, external mixing type of atomizer is considered preferable. Such atomizers have the flexibility to provide varying droplet size and velocity. See Layernia, "Spray Atomization and Deposition," John Wiley & Sons, 1996 and U. Heck et al., "Atomization and Sprays," Vol. 10, pp. 25-46 (2000), the contents of which are incorporated herein by reference. Those skilled in the art will be able to understand how to implement the invention using such devices after being taught by the present disclosure. Accordingly, even further explicit details of such devices are omitted here for sake of clarity of the invention.

According to certain aspects, the spraying process generated by any of the above methods is preferably controlled such that the number and type of contact of aluminum with silicon is controlled. To form a blanket back surface field the first layer of sprayed aluminum contacts the silicon at a temperature slightly above the Al—Si eutectic temperature of 577 C. The subsequent droplets of aluminum contact the wafer surface a much lower temperature so that any further reaction with the silicon substrate is limited. This way the wafer warpage during the solidification of aluminum is limited. The temperature of the aluminum droplets when it comes in contact with the wafer surface can be controlled by controlling the distance of the applicator 250. Other methods such as controlling the velocity of the droplets and the temperature of the melt, etc. are well known to those practicing the art of melt spray or atomization.

The spray parameters and the liquid amount are further set such that spraying onto a portion of the substrate continues until the desired thickness T of metal is built up (typically about 1 to 5 um for back metallization). According to certain aspects of the invention, once the desired initial thickness of metal is deposited the wafer distance is increased so that the metal droplets fall on a solidified base of aluminum to reduce the heat load on the wafer.

The spray parameters are further controlled such that the molten aluminum 214 is in the form of a very fine mist or spray, Those skilled in the art will be able to understand how to control the distances in accordance with these preferences after being taught by the present disclosure.

As shown in FIG. 2C, the Al/Si interface created in embodiments of the invention is highly reflective because of the epitaxial Si layer 216 at the interface with a layer 210 of pure aluminum on the back. According to certain aspects, the interface roughness is also related to the average drop size of molten Al. The roughness, hence, can be controlled by controlling the droplet size impinging on the back side of the substrate. This can further improve sunlight capture by the cell (i.e. reflectivity, and thus sunlight entrapment, is improved as interface roughness is decreased).

According to other aspects, the aluminum film 210 is fully dense; with low resistivity close to 3 μohm-cm. It also has sufficient rigidity to prevent separation during further processing and use. Moreover, there is reduced wafer bowing as the volume change of the film 210 per change in temperature is much smaller than that for the screen printing paste.

In embodiments, the aluminum spray process described above can be followed by spraying tin (melting point, 232 C), preferably using the same or another device 250 described above. The deposition of hot Tin dissolves any aluminum oxide that may have formed on the surface of aluminum, thus providing for good electrical contact.

Back side metallization processing with point contacts and localized back surface field (BSF) according to certain other aspects and embodiments of the invention will now be described in connection with FIGS. 2D to 2F.

In this scheme, a dielectric film 220 is first formed/deposited on the back surface of the wafer. The dielectric film 220 can be thermally grown silicon oxide, deposited SiC, or a composite of these films with silicon nitride at the top. This invention is no way limited to the type of dielectric film(s) used. A dielectric film or films suitable for this application with respect to surface passivation and other required properties can be used. The dense aluminum film on a dielectric surface with contacts made to silicon only at certain places provides for the best reflectivity possible.

Figure 2D:
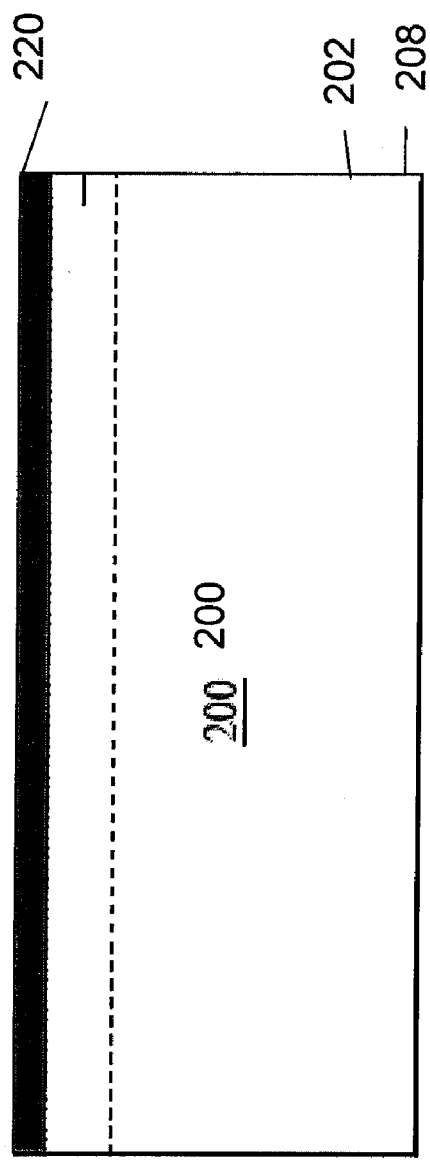
Figure 2E:
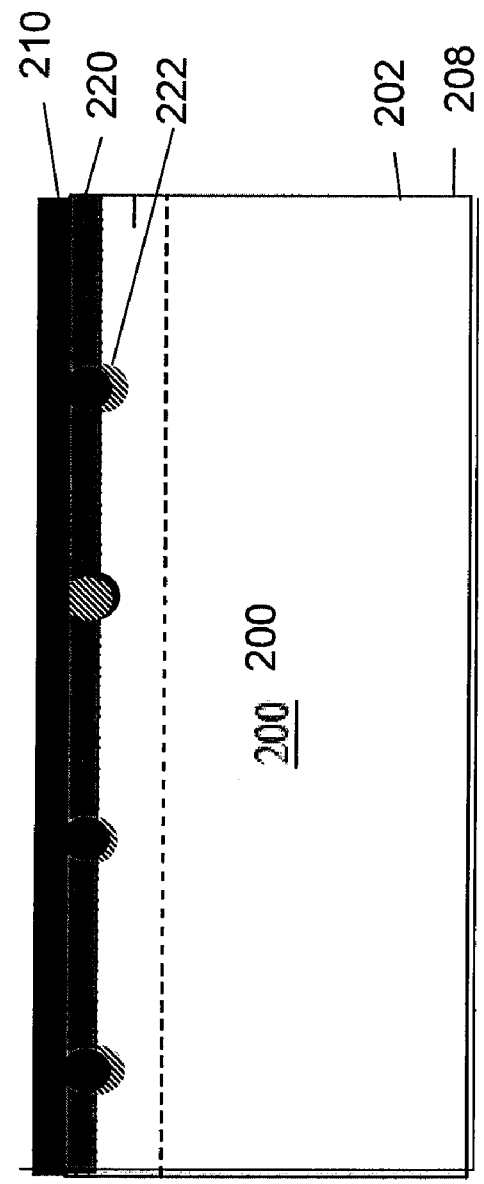
Figure 2F:
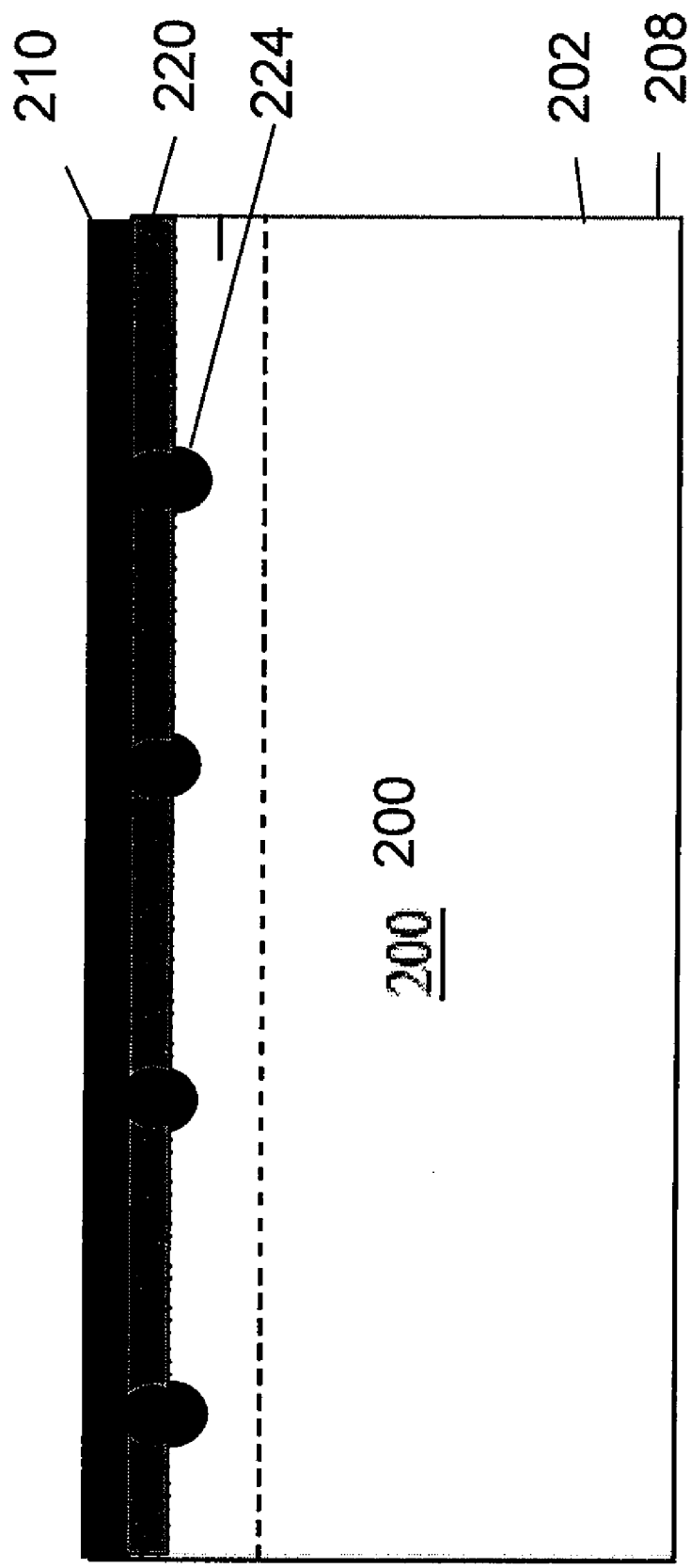

As shown in FIG. 2D, the back surface of the wafer has a dielectric layer 220. Next, in FIG. 2E, the localized contacts with aluminum are first made by spraying droplets of aluminum using the above described atomization/spray techniques and device 250, such that the temperature and velocity of droplets are high enough to penetrate the dielectric surface and react with the silicon underneath. In one embodiment, the wafer is kept close enough to the spray nozzle and/or outlets so that the metal after penetrating the dielectric film is at a temperature higher than 577C. This causes the formation of Al—Si eutectic 222. Next, the full thickness of the aluminum layer 210, about 1 to 5 um thick, is built up by with aluminum droplets that contact the surface at the desired lower temperature and velocity so as not to penetrate the dielectric layer.

Then, during the subsequent cooling, the silicon doped with Al separates out, thereby forming the BSF 224. The BSF 224 however is now localized, present only where the aluminum droplets deposited during the beginning of the spray sequence have contacted the silicon and formed the Al—Si eutectic.

In one embodiment the wafer can be heated initially to provide for the formation of localized contacts (i.e. localized areas that do not spread over the entire surface).

Finally, in embodiments, a layer of tin can be sprayed over layer 210 using a mask in areas where solderability is required. The spray process can be the same as any of those described above and/or using the same or similar device as 250 as described above.

There are many advantages of the invention over conventional processes in addition to those already described above. For example, it is a non-contact process as opposed to the screen printing processes of the prior art. This can improve manufacturing yield among other things. As another example, it is a low cost process. The actual time taken for deposition can be on the order of only a second or so. No separate firing step is required. Also the liquid consumption is kept to a minimum required.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims encompass such changes and modifications.

What is claimed is:

1. A method for processing a solar cell substrate, comprising:
   projecting drops of metal in a molten state from the metal applicator toward a back side of the solar cell substrate until sufficient metal has been deposited so as to fully metallize the back side of the solar cell substrate to form one or more of a full surface back contact, back surface field and a highly reflective film over the whole backside;
   forming a dielectric film on the back side before performing the projecting step; and
   controlling the projecting step to form the full surface back contact through the dielectric film such that the metal stays above a eutectic temperature of Al—Si as it passes through the dielectric film.

2. A method according to claim 1, wherein the metal comprises aluminum.

3. A method according to claim 1 wherein the substrate comprises silicon.

4. A method according to claim 1 further comprising:
   controlling a cooling of the metal following the projecting step such that the metal remains above the eutectic temperature of Al—Si for a predetermined amount of time.

5. A method according to claim 4, wherein the predetermined time corresponds to a time needed to form a backside field in the solar cell substrate.

6. A method according to claim 4, wherein the metal comprises aluminum.

7. A method according to claim 4, wherein the substrate comprises silicon.

8. A method for processing a solar cell substrate, comprising:
   projecting drops of metal in a molten state from the metal applicator toward a back side of the solar cell substrate until a sufficient amount of the metal has been deposited so as to form full surface contacts completely over the backside;
   forming a dielectric film on the back side before performing the projecting step; and
   controlling the projecting step to form the full surface contacts through the dielectric film such that the metal stays above a eutectic temperature of Al—Si as it passes through the dielectric film.

9. A method according to claim 8, wherein the metal comprises aluminum.

10. A method according to claim 9, further comprising:
    controlling a cooling of the metal following the projecting step such that the metal remains above the eutectic temperature for a predetermined amount of time.

11. A method according to claim 10, wherein the predetermined time corresponds to a time needed to form a backside field in the solar cell substrate.

* * * * *